United States Patent
Chen et al.

(10) Patent No.: US 11,428,733 B1
(45) Date of Patent: Aug. 30, 2022

(54) ON-DIE VIRTUAL PROBES (ODVP) FOR INTEGRATED CIRCUITRIES

(71) Applicant: XILINX, INC., San Jose, CA (US)

(72) Inventors: Yanran Chen, San Jose, CA (US); Edward C. Priest, Palo Alto, CA (US); Martin L. Voogel, Niwot, CO (US); Hing Yan To, Cupertino, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 17/339,223

(22) Filed: Jun. 4, 2021

(51) Int. Cl.
*G01R 31/28* (2006.01)

(52) U.S. Cl.
CPC .............. *G01R 31/2856* (2013.01)

(58) Field of Classification Search
CPC .......... G01R 19/00; G01R 19/0007; G01R 29/0814; G01R 29/0842; G01R 31/2642
See application file for complete search history.

(56) References Cited

U.S. PATENT DOCUMENTS

| | | | |
|---|---|---|---|
| 2003/0214334 A1* | 11/2003 | Gomm | H03K 23/66 327/158 |
| 2008/0224742 A1* | 9/2008 | Pomichter | G06F 1/08 327/119 |

* cited by examiner

*Primary Examiner* — Tung X Nguyen
(74) *Attorney, Agent, or Firm* — Patterson + Sheridan, LLP

(57) ABSTRACT

Some examples described herein provide for an on-die virtual probe in an integrated circuit structure for measurement of voltages. In an example, an integrated circuit comprises a voltage-controlled frequency oscillator circuitry and a processor circuitry. The voltage-controlled frequency oscillator circuitry comprises a plurality of circuitry components and is configured to generate a signal having a frequency related to a supply voltage. The voltage-controlled frequency oscillator circuitry is disposed at a location of the integrated circuit proximal to the supply voltage being monitored. The processor circuitry is configured to identify a relationship between the frequency of the signal and the supply voltage. The processor circuitry is also configured to determine a value of the supply voltage associated with the signal based on the identified relationship. The processor circuitry further monitors on-die transient voltages at the location of the integrated circuit based on the value of the supply voltage.

20 Claims, 8 Drawing Sheets

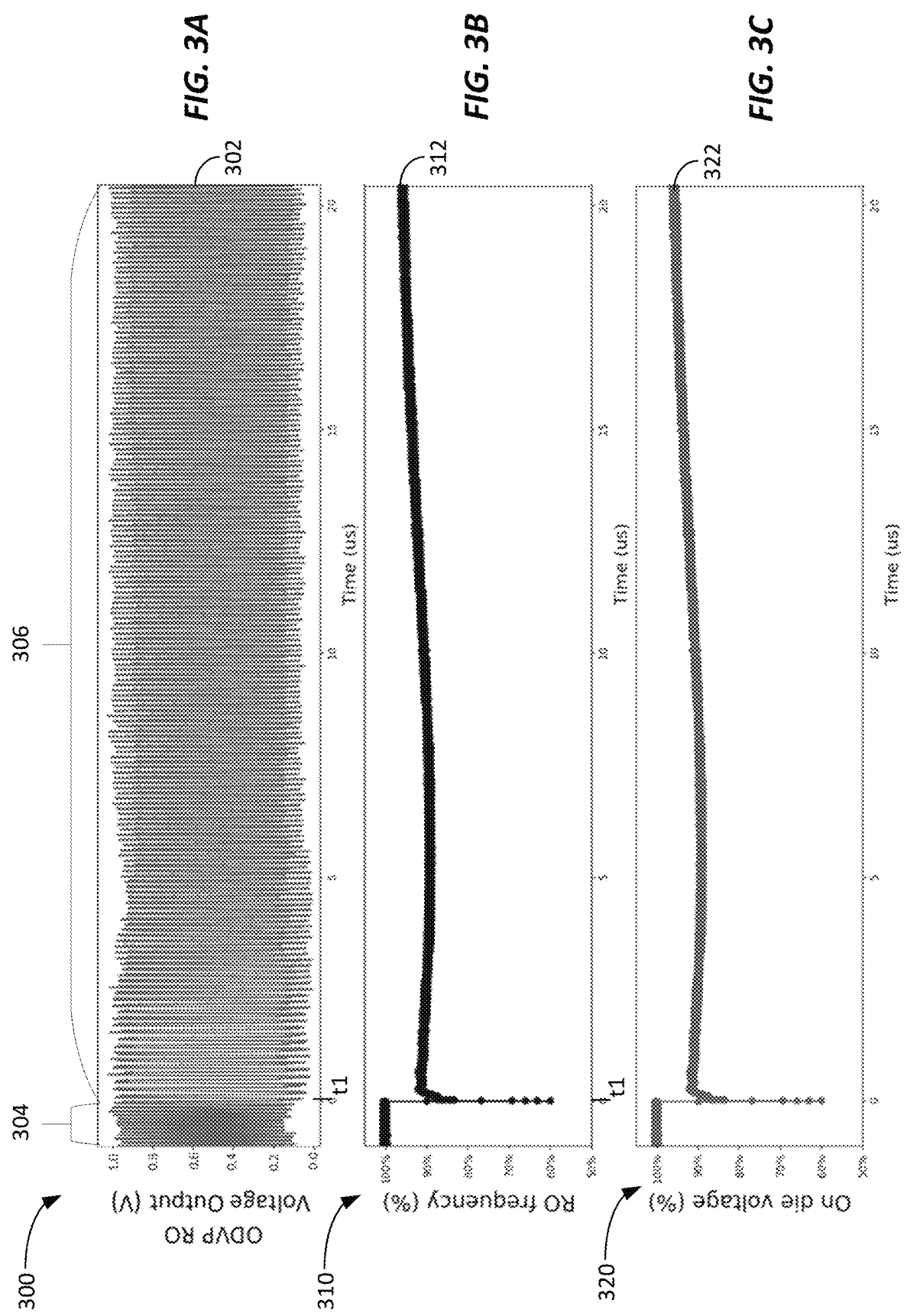

ON-DIE VIRTUAL PROBES (ODVP) FOR INTEGRATED CIRCUITRIES

TECHNICAL FIELD

Examples of the present disclosure generally relate to measuring conditions, such as voltage levels and voltage drops, at locations in an integrated circuit during operation of the integrated circuit.

BACKGROUND

As technology evolves, integrated circuits (ICs) are including increasingly large numbers of hardware components, which lead to increased power consumption and density. However, while power consumption and density statistics are increasing, maximum allowable voltage drops within the IC often decrease, for example, as components become more sensitive to such voltage drops. in modern ICs, on-die voltages of supply rails and other circuit components and circuitry may experience steady state and transient power noises that can effect performance of the ICs, where the components of the ICs can be highly sensitive to such noises and corresponding fluctuations in supply voltages. For example, such fluctuations in supply voltages can cause timing, performance, and integrity issues, among others. By monitoring the steady state and transient voltage drops of the IC, users can diagnose performance issues and the like for the ICs.

The total voltage drop on a supply rail or other component comprises two components: static IR-drop from steady state equivalent currents through resistances and impedances and AC voltage drop from rapid changes in currents. Some sensing techniques are able to monitor only steady state IC voltages at fixed locations. Thus, improvements in IC voltage sensing and similar monitoring are desirable.

SUMMARY

Some examples described herein provide for an on-die virtual probe in an integrated circuit structure for measurement of voltages. In an example, an integrated circuit comprises a voltage-controlled frequency oscillator circuitry and a processor circuitry configured to measure supply voltages at locations of the integrated circuit. The voltage-controlled frequency oscillator circuitry comprises a plurality of circuitry components and is configured to generate a signal having a frequency related to a supply voltage. The voltage-controlled frequency oscillator circuitry is disposed at the location of the integrated circuit proximal to the supply voltage being monitored. The processor circuitry is configured to identify a relationship between the frequency of the signal and the supply voltage. The processor circuitry is also configured to determine a value of the supply voltage associated with the signal based on the identified relationship. The processor circuitry further monitors on-die transient voltages at the location of the integrated circuit based on the value of the supply voltage.

Another embodiment described herein is an integrated circuit. The integrated circuit comprises a plurality of inverter circuits connected in series to form a loop circuitry configured to generate an oscillatory signal having a frequency related to a supply voltage. The plurality of inverter circuits are disposed on the integrated circuit near a target location. A value of the supply voltage is determined based on an identified relationship between the frequency of the oscillatory signal and the supply voltage On-die voltages at the target location of the integrated circuit are monitored based on the value of the supply voltage.

Another embodiment described herein is a method for measuring transient on-die transient voltages of an integrated circuit. The method includes identifying one or more programmable logic blocks at a location of the integrated circuit proximal to a supply voltage to monitor, The method further includes programming the one or more programmable logic blocks to create a voltage-controlled frequency generating circuitry. The method also includes generating a signal having a frequency related to the supply voltage. The method additionally includes identifying a relationship between an aspect of the signal and the supply voltage. The method additionally comprises determining a value of the supply voltage associated with the signal based on the identified relationship. The method also comprises monitoring the on-die transient voltages at the location of the integrated circuit based on the value of the supply voltage.

These and other aspects may be understood with reference to the following

BRIEF DESCRIPTION OF DRAWINGS

So that the manner in which the features recited above can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 3A depicts an example of a graph showing output oscillations between 0 and 1 for an oscillating signal generated by an ODVP, such as the oscillating signal generated by the RO ODVP of FIG. 2.

FIG. 3B depicts an example of a graph showing a waveform representing a frequency of a voltage-controlled signal generated by an ODVP, such as the RO ODVP of FIG. 2, as a percentage of the frequency range of the signal.

FIG. 3C depicts an example of a graph showing a waveform representing an on-die voltage measured by an ODVP, such as the RO ODVP of FIG. 2, as a percentage of the voltage range of the supply voltage.

DETAILED DESCRIPTION

Figure 1:
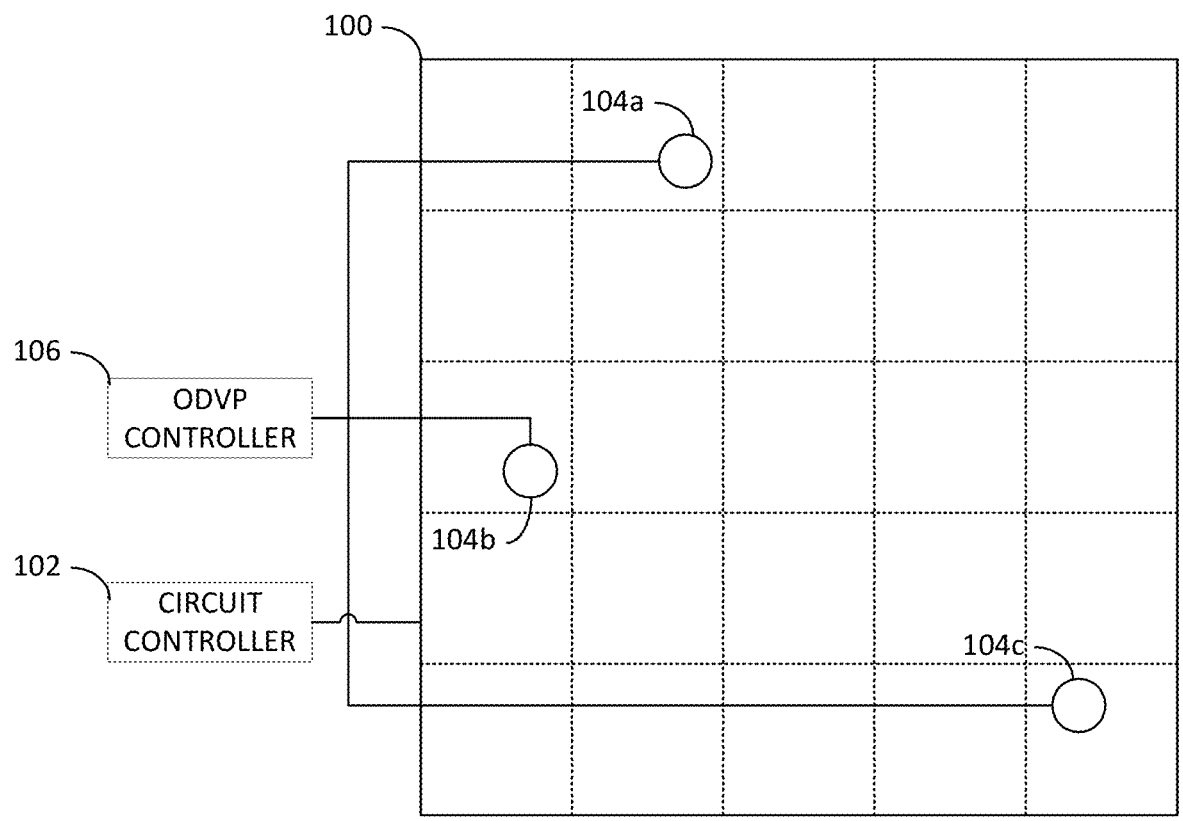
FIG. 1 is a block diagram of an IC with multiple on-die virtual probes (ODVPs) at different locations of the IC, according to an example embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

On-die voltage measurements may directly reflect integrated circuit (IC) performance in response to steady-state or transient power noises. For example, a transient power noise can result in a worst-case supply voltage to and corresponding performance by the IC or a component thereof due to a voltage surge or sag caused by the transient power noise. However, obtaining both the on-die steady-state and transient voltage measurements at desirable target locations along the IC is problematic.

Certain on-die voltage sensing techniques for ICs utilize direct voltage probing or on-die voltage sensory circuits. The direct voltage probing circuit may perform voltage probing at a package level, for example, via probing voltage rails at the package ball grid array (BGA). Thus, corresponding voltage measurements may not be representative of the on-die transient voltages. Furthermore, since the direct voltage probing circuit includes specific, fixed locations for the package BGA (for example, where the BGA is physically installed in a corresponding circuit board), the voltage measurements generated by the direct voltage probing circuit may not be flexible enough to enable voltage measurement at target locations of the IC different from an installation location of the BGA with respect to the IC. With respect to certain on-die voltage sensory circuits, such circuits are also implemented at fixed locations of the IC and, furthermore, are unable to measure transient on-die voltages, instead providing an average or steady-state voltage. Thus, such on-die voltage sensory circuits are unable to enable voltage measurement at dynamic target locations and provide information for analysis of transient on-die voltage signals.

In fact, the steady-state voltage levels measured by the direct voltage probing or on-die voltage sensory circuits may mask the transient voltage swings that can create supply voltage issues in the IC. For example, when the sensory circuits provide a steady-state voltage measurement, such sensory circuits may be unable to identify localized or die-level voltage droops or voltage spikes or drops that occur quickly or are brief. Such droops, spikes, or drops may be of too short duration to impact and, thus, be invisible in the steady-stage voltage measurement from the sensory circuits but still be of sufficient levels to create issues in the IC.

Embodiments herein describe an on-die virtual probe (ODVP) that can perform transient and steady-state voltage monitoring at die level. The ODVP comprises a circuitry formed from one or more functional blocks. such as programmable logic blocks (for example, unused lookup tables (LUTs) or similar components), and/or one or more hardwired components disposed on the IC near a target location (or location of interest).

Where the ODVP is used to monitor transient and steady-state voltages, the ODVP may generate a signal related to a supply voltage of the IC, such as a voltage-controlled oscillating signal having a frequency that is related to the supply voltage. The voltage-controlled oscillating signal can be monitored in real-time to observe the transient and steady-state voltage measurements of the supply voltage at the target location. Thus, the ODVP is able to monitor the supply (or similar) voltage based on measuring one or more aspects of a non-voltage signal.

In some embodiments, hardwired components are used to create the ODVP to monitor the transient and steady-state voltages at fixed, pre-determined locations. In some embodiments, the ODVP can be implemented dynamically using unused programmable logic blocks, such as LUTs, at any target location relative to the IC.

Thus, the ODVP enables monitoring of the steady-state and transient on-die voltages at flexible locations at up to gigahertz (GHz) sampling rates. Being able to monitor the steady-state and transient on-die voltage drops enables analysis of IC performance issues that might otherwise escape detection.

As introduced above, knowledge of the on-die transient and steady-state voltages for target locations of an IC can directly impact design, operation, and maintenance of the IC. For example, under and/or over voltage conditions (for example, voltages that fall below or exceed voltage specifications for the IC) can cause portions of the IC to be nonfunctional or to malfunction. Therefore, monitoring the transient and steady-state on-die voltages of the IC at or near the target locations of the IC that include the nonfunctional or malfunctioning portions of the IC can help diagnose power related issues for these nonfunctional or malfunctioning portions. The ODVPs, as described herein, enable the steady-state and transient voltage monitoring of the target locations of the IC using, for example, voltage dependent frequency circuitries, as described in more detail below.

FIG. 1 is a block diagram of an IC 100 with multiple ODVPs 104a-104c at different locations of the IC 100, according to an example embodiment.

Though not shown explicitly in FIG. 1, the IC 100 may include a plurality of solid state components, including programmable devices (e.g., programmable logic devices (PLDs) such as field-programmable gate arrays (FPGAs), etc.) and/or application-specific ICs (ASICs) (e.g., central processing units (CPUs), graphics processing units (GPUs), memories, etc.), wire traces, and the like that enable the IC to perform one or more functions. One or more, if not all, of the solid state components can meet its performance specification only when the operating voltage at one or more transistors of the solid state component is within a specified range. In some embodiments, one or more of these components, such as processing components, sensor circuitry, memory circuitry, and the like, have a relatively high sensitivity to transient voltage drops or voltage droop, for example, with respect to a supply voltage to the one or more components. The ODVPs 104a-104c can be placed at locations that are relatively proximate to the one or more components and the supply voltage to the one or more components to monitor the transient and steady-state voltages received by the one or more components. Thus, the ODVPs 104a-104c can be used to monitor and diagnose issues in the supply voltage, such as fluctuations in the transient on-die voltages, to the one or more components as needed.

An ODVP 104 may comprise or embody circuitry that generates a voltage-controlled oscillating signal based on a supply voltage at a target location of the IC 100. A frequency of the oscillating signal varies with respect to time dependent or based on a magnitude of the supply voltage. In some embodiments, the frequency of the oscillating signal is directly proportional to the magnitude of the supply voltage. In certain embodiments, the frequency of the oscillating signal can be proportional to the supply voltage according to a linear or non-linear function, The supply voltage having the magnitude that is proportional to the frequency of the oscillating signal may be an input to one or more components of the ODVP 104.

In some embodiments, the ODVP 104 comprises one or more of soft logic and/or hard logic components, or the like. When connected together, the soft logic and/or hard logic components create the circuitry that generates the voltage-controlled oscillating signal. In some embodiments, the circuitry comprises or is similar to a voltage-controlled oscillator. For example, the ODVP 104 comprising the soft logic and/or hard logic components comprises a ring oscillator or similar device.

A soft logic component may comprise programmable or configurable logic blocks, such as LUTs based logic blocks, multiplexer (MUX) based logic blocks, and so forth. Each of the programmable logic blocks may be connected by one or more reconfigurable interconnects. Generally, a soft logic component can be reconfigured or reprogramed to dynamically change the functionality of the soft logic component with no extra silicon development costs. Further details are provided below with respect to FIGS. 6A-6C and the corresponding description.

When formed using soft logic components, the ODVP 104 can be implemented on an FPGA fabric of the IC 100 by configuring or programming one or more programmable logic blocks, such as unused LUTs or the like. While the examples below recite LUTs to create the ODVP 104, the ODVP 104 may similarly be formed from other programmable logic blocks (for example, a programmable logic array (PLA), programmable array logic (PAL), a complex programmable logic device (CPLD), etc.). Soft logic components (e.g., LUTs) enable the creation of the ODVP 104 that generates the voltage-dependent oscillating signal at any location of the IC 100 that includes unused LUTs and interconnect tiles. In some embodiments, the unused LUTs can be combined with one or more additional components, such as a hardwired inverter or other logical gates or structures when creating the ODVP 104.

One benefit of creating the ODVP 104 using soft logic components is the ability to create the ODVP 104 dynamically at any location(s) of the IC 100 where there are unused programmable logic blocks and where transient and steady-state voltage monitoring needs to be performed. For example, when a user identifies that a component of the IC 100 appears to malfunction or be nonfunctional, the user can identify unused LUTs on the IC 100 at a location relative to that component and to the supply voltage for that component. The location relative to the component and to the supply voltage may comprise a location close enough to the component and to the supply voltage that circuitry placed at that location can measure and monitor the transient and steady-state on-die supply voltage at the location. The user then programs the identified unused LUTs and uses corresponding interconnects to create the ODVP 104. In certain embodiments, the identified LUTs can be programmed as a string of stages having an odd number of inversions to create a ring oscillator that generates a voltage-dependent oscillating signal that has a frequency dependent on the supply voltage of the component. Thus, the ODVP 104 comprising the ring oscillator can be dynamically created at any target location of the IC 100 based on the availability of unused LUTs.

Another benefit of implementing the ODVP 104 using the soft logic components is the ability for the user to dynamically remove the ODVP 104 from the target location or move the ODVP 104 to another target location once any voltage issues are identified and rectified and the components are operating appropriately. Unlike hardwired circuitries, the soft logic-based ODVP 104 can be disabled and reprogrammed when no longer needed. Thus, the use of soft logic components to create the ODVP 104 can introduce a layer of flexibility not available in a hard logic ODVP 104. Furthermore, this flexibility to reprogram the soft logic components of the ODVP 104 offers a layer of security that can prevent future users of the IC 100 from being able to use the ODVP 104, if so desired.

A hard logic component may comprise a hardwired logic gate or similar component, such as a hardwired inverter or similar gate. Such hard logic components generally are not reprogrammable or reconfigurable once established as part of the IC 100. For example, the hard logic components as described herein may be used in an ASIC or similar IC.

Where prior art sensing techniques perform voltage measurements at different circuitry levels (for example, package level or higher) at fixed locations or are limited to steady-state on-die voltage measurements, the ODVPs described herein can provide improved flexibility, security, and signal monitoring.

In certain embodiments, one or more of the ODVPs 104a-104c is formed using hard logic rather than soft logic, for example, in an ASIC or similar IC.

When formed using hard logic components, the ODVP 104 can be implemented using one or more inverters or the like. In some embodiments, the inverters can be combined with one or more additional components, such as other hardwired logical gates or structures to create the ODVP 104 in the ASIC.

One benefit of creating the ODVP 104 using hard logic components is the ability to employ the ODVP 104 in an ASIC type IC where programmable logic blocks may not be available.

FIG. 1 further depicts a circuitry controller 102 configured to control the one or more components of the IC 100. In some embodiments, the circuitry controller 102 may be disposed separate from the IC 100 (as shown) or on the IC 100. FIG. 1 also depicts an ODVP controller 106 configured to control the one or more ODVPs 104a-104c and obtain or receive, for example, the voltage-controlled oscillating signal generated by each of the ODVPs 104a-104c. In some embodiments, the ODVP controller 106 may be disposed separate from the IC 100 (as shown) or on the IC 100. In certain embodiments, the circuitry controller 102 and the ODVP controller 106 may be integrated into a single controller.

In some embodiments, the ODVP controller 106 may be configured to calibrate the one or more ODVPs and identify the voltage corresponding to the voltage-controlled oscillating signal.

Figure 2:
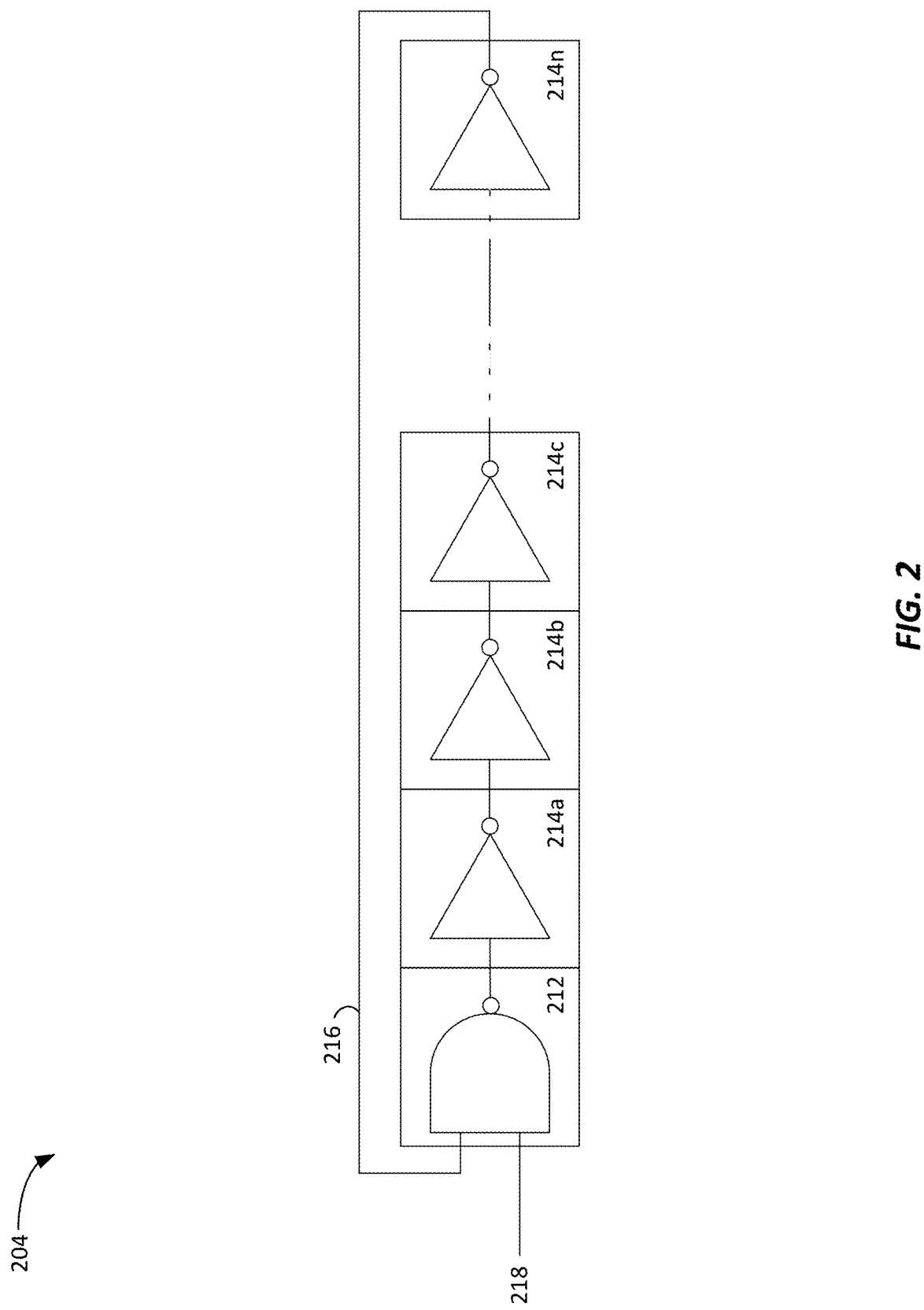
FIG. 2 depicts a schematic of an ODVP of FIG. 1 configured as a ring oscillator (RO) ODVP that performs or functions as an on-die voltage sensor, according to an example embodiment.

FIG. 2 depicts a schematic of an ODVP 104 of FIG. 1 configured as a ring oscillator (RO) ODVP 204 that performs or functions as an on-die voltage sensor, according to an example embodiment. The RO ODVP 204 comprises a plurality of inverting stages. Specifically, the RO ODVP 204 comprises a NAND gate stage 212 and a number of inverter stages 214a-214n. In some embodiments, one or more of the NAND gate stage 212 and the number of inverter stages 214a-214n can be implemented as soft logic and/or hard logic. In the FPGA environment introduced above, each of the NAND gate stage 212 and the number of inverter stage 214a-214n can be formed from programmable logic blocks, such as unused LUTs.

The NAND gate stage 212 comprises inputs 216 and 218, described in further detail below. The NAND gate stage 212 generates an output of 1 when the inputs 216 and 218 are both not 1. In some embodiments, the NAND gate stage 212 may be replaced with or configured as any other logical structure that enables the loop circuitry of the RO ODVP 204 to continuously operate in a loop until a stop or similar command is received. When the RO ODVP 204 has an odd number of inversions in the loop circuitry, the loop satisfies the "Barkhausen Criterion" of having a loop gain of 1 at 180° phase shift, therefore producing a sustainable oscillatory signal between 0 and 1.

Each of the inverter stages 214a-214n comprises a single input and is configured to invert the signal received at the single input. Thus, each inverter stage 214 is configured to generate an output of 1 when the input is 0 and generate an output of 0 when the input is 1. In some embodiments, the inverter stage 214 may be replaced with or configured as any other logical structure that generates an output that is opposite of the input.

The RO ODVP 204 described herein generates an output that oscillates between two values, such as 0 and 1, representing logic low and logic high, when the number of NAND stages 212 and inverter stages 214 (or the RO ODVP 204 as a whole) comprises an odd number of inversions. Specifically, in operation, the RO ODVP 204 may receive an enable or start command on the input 218 of the NAND gate stage 212. When the RO ODVP 204 is previously inactive, receiving the enable or start command on the input 218 may cause the NAND gate stage 212 to generate an output of 1. Each inverter stages 214a-214n then inverts its input to generate an output that is fed to a subsequent inverter stage 214, with the exception of the inverter stage 214n. The output from the inverter stage 214n is fed to the input 216 of the NAND gate stage 212, which generates a 1 or a 0 based on the value of the input 216 and whether the enable signal is received on the input 218. Thus, the RO ODVP 204 generates an oscillating signal (for example, as seen between the output of the inverter LUT stage 214n and the input 216) over time.

The oscillating signal generated by the RO ODVP 204 may correspond to the voltage-controlled oscillating signal introduced above. The oscillating signal generated by the RO ODVP 204 may oscillate with a frequency based on Equation 1 below.

$$f = \frac{1}{T} = \frac{1}{N \cdot \Delta t} \qquad \text{Equation 1}$$

Where:
f is the frequency of the oscillating signal;
N is the number of stages in the RO ODVP 204; and
$\Delta t$ is the average time (propagation) delay each stage takes to generate an output from its input.

In some embodiments, the stages of the RO ODVP 204 comprise a mix of inverting and non-inverting stages, as long as the total number of inversions in the RO ODVP 204 is odd. For example, where N is even, the RO ODVP 204 may comprise an odd number of NAND stages and an odd number of inverter stages 214a-214n. Alternatively, where N is odd, the RO ODVP 204 may comprise an even number of NAND stages and an odd number of inverter stages 214a-214n, or an odd number of inverter stages 214a-214n and no NAND stage. A period of the oscillating signal is equal to the delays of the NAND gate stage 212 and the inverter stages 214a-214n. Because the delays of the NAND gate stage 212 and the inverter stages 214a-214n are proportional to the supply voltage, the period of the oscillating signal, and thus the frequency of the oscillating signal, is also proportional to the supply voltage.

Thus, the oscillating signal has a frequency that is inversely proportional to the number of stages in the RO ODVP 204 (including both the NAND gate stage 212 and the inverter stages 214a-214n) and a time delay required for each of the NAND gate stage 212 and the inverter stages 214a-214n to individually perform the respective operations. For example, the NAND gate stage 212 and the inverter stages 214a-214n have a time delay to generate their respective outputs. Because the time delay for each stage to generate its output is sensitive to the supply voltage (for that stage), process variation, local temperature, and so forth, the frequency of the oscillating signal is inversely proportional to the supply voltage.

Because the frequency of the oscillating signal is inversely proportional to the supply voltage, monitoring the frequency of the oscillating signal can correspond to monitoring the supply voltage at the location of the RO ODVP 204. A controller, such as the ODVP controller 106 of FIG. 1, may monitor the frequency of the oscillating signal. The controller may be configured or calibrated to identify the supply voltage based on the monitored frequency of the oscillating signal. In some embodiments, a relationship between the supply voltage and the frequency of the oscillating signal may be identified via a calibration process. In certain embodiments, the calibration process for an individual ODVP, such as the RO ODVP 204, may involve a direct frequency measurement of the ODVP oscillatory signal off-chip (for example, off the IC and the RO ODVP) by an oscilloscope at known voltages within a range. In some embodiments, an on-die counter circuitry can be part of the ODVP, part of the ODVP controller, or part of a support circuit for the ODVP or the ODVP controller. The on-die counter circuitry can monitor and count the number of transitions between 0 and 1 for the output signal generated by the voltage-controlled frequency generating circuitry over a period (for example, over a period much longer than the ODVP oscillation period). The count generated by the counter circuitry and the period over which the count was generated can then be used to identify the frequency of the output signal at known voltages within a range. Based on the relationship between the supply voltage and the frequency of the oscillating signal, the ODVP may then generate real-time heat maps of on-die steady-state and AC voltage drops (at up to 1 GHz sampling rate) during hardware testing of the IC 100 with the RO ODVP 204 under target current events. The generated on-die voltage drop information can be correlated with current events for diagnostic purposes.

Based on the identified relationship between the frequency of the oscillating signal and the supply voltage, the controller can determine a value of the supply voltage at the location of the ODVP, such as the RO ODVP 204. By monitoring the frequency of the oscillating signal in real-time, the controller is able to monitor the transient voltage values of the supply voltage at the target location of the RO ODVP 204. By monitoring the frequency of the oscillating signal over a period, the controller monitors a steady state voltage signal of the supply voltage for that period at the location of the RO ODVP 204.

In some embodiments, the sensing resolution of the RO ODVP 204 may be set to be larger than the Nyquist frequency of the transient voltage signal to avoid aliasing. In certain embodiments, the target transient voltage response is around 2 ns, which corresponds to a Nyquist frequency of 1 GHz, making the optimal oscillation frequency of the RO ODVP 204 larger than 1 GHz.

FIG. 3A depicts an example of a graph 300 showing oscillations between 0 and 1 for an oscillating signal generated by an ODVP, such as the oscillating signal generated by the RO ODVP 204 of FIG. 2. The graph 300 shows the output of the RO ODVP 204, for example, measured in volts, along the y-axis, as a function of time, along the x-axis. The graph 300 includes a continuous trend line 202 that fluctuates with time. The trend line 302 shows that the oscillation period of the signal is relatively small before and until approximately 0 microseconds (µs), during a first time portion 304, which is prior to initiating of, for example, a current event that could cause a disruption to a supply voltage of a component of the IC. At time $t_1$ between 0 and 5 µs (approximately 0 µs), the oscillation period of the signal increases noticeably. This increased period starts to decrease again during a second time portion 306. While the period of the oscillating signal during the second time portion 306 is decreasing, it does not decrease to the period during the first time potion 304.

Thus, the graph 300 of FIG. 3A shows that some aspect related to the ODVP generating the oscillating signal shown in FIG. 3A changes, which results in the increased period that occurs at time $t_1$ and does not fully recover for the time represented by the graph 300, though the period does improve (decrease) noticeably after time $t_1$.

FIG. 3B depicts an example of a graph 310 showing a waveform 312 representing a frequency of the oscillating signal generated by an ODVP, such as the RO ODVP 204 of FIG. 2, as a percentage of the frequency range of the oscillating signal. The graph 310 shows the frequency of the signal output by the RO ODVP 204, for example, as a percentage of its maximum frequency, along the y-axis, as a function of time, along the x-axis. The waveform 312 shows how the frequency of the oscillating signal includes a continuous trend that fluctuates with time. The waveform 312 shows that the oscillating signal has a frequency of approximately 100% until about 0 µs (approximately $t_1$), where the frequency of the oscillating signal drops to approximately 60% before recovering to approximately 90% of the frequency of the oscillating signal. Thus, the frequency drop is momentary, lasting less than 1 µs, but being detectable by the ODVP. The frequency of the oscillating signal continues to increase over time.

Thus, the graph 310 of FIG. 3B shows the frequency of the oscillating signal generated by the ODVP, as a percentage, as the period of the oscillating signal fluctuates.

FIG. 3C depicts an example of a graph 320 showing a waveform 322 representing an on-die voltage measured by an ODVP, such as the RO ODVP 204 of FIG. 2, as a percentage of the voltage range of the supply voltage. The graph 320 shows the voltage measured by the ODVP, for example, as a percentage of the range of the supply voltage being measured, along the y-axis, as a function of time, along the x-axis. The waveform 322 shows how the on-die voltage includes a continuous trend that fluctuates with time. Specifically, the waveform 322 shows that the on-die voltage fluctuations correspond to fluctuations in the oscillating output of the ODVP and the frequency of the oscillating output. For example, the on-die voltage is approximately 100% of the supply voltage until approximately 0 µs, where the on-die voltage drops to approximately 60% of the supply voltage for just a moment, before recovering to approximately 90% of the supply voltage. The timing of the fluctuations aligns with the fluctuations in the frequency of the oscillating signal shown in graph 310 and the period shown in graph 300.

Thus, the graphs 310 and 320 show how the frequency of the oscillating signal generated by the ODVP, as a percentage, relates to the on-die voltage at the location of the ODVP. Based on calibrating and performing hardware testing, as introduced above, the ODVP is able to provide a measurement of transient on-die voltages of the IC at locations where the ODVP is implemented.

In some embodiments, an ODVP controller, such as the ODVP controller 106 of FIG. 1 is calibrated with a relationship between the frequency and period of the oscillating signal generated by the ODVP and the transient on-die voltage measured by the ODVP at the location of the ODVP. For example, the average frequency of the oscillating signal may correspond to the steady-state on-die voltage, while the transient behavior of the oscillating signal may correspond to the transient voltage fluctuations of the transient on-die voltage at the location of the ODVP. As such, calibration and hardware testing details may be stored in or associated with the ODVP controller.

Figure 4A:
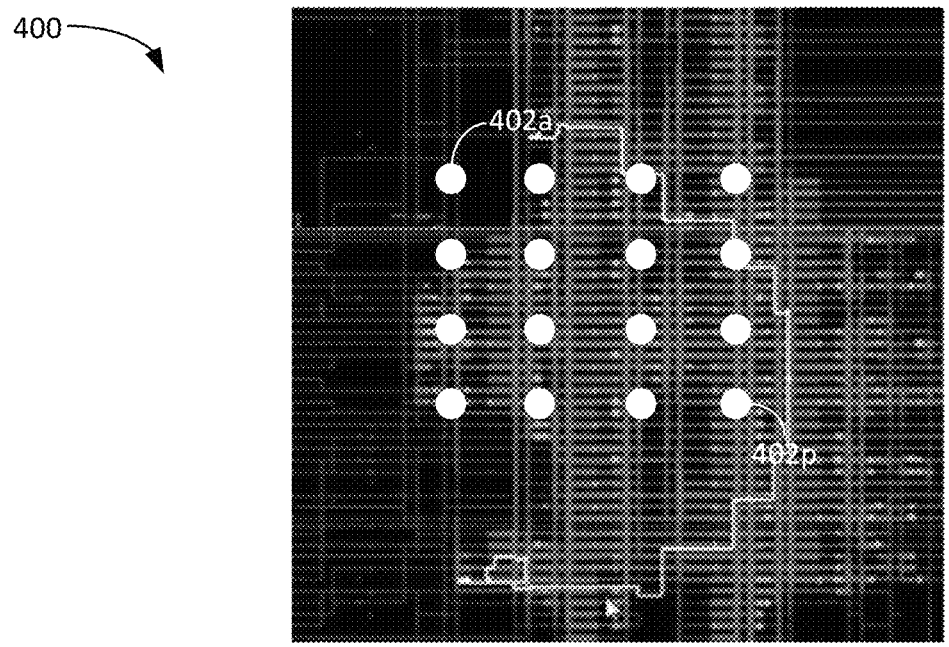
FIG. 4A shows an example layout of an integrated circuit with sixteen locations where ODVPs, such as the RO ODVP of FIG. 2.

FIG. 4A shows an example layout 400 of an integrated circuitry with sixteen locations 402a-402p where ODVPs, such as the RO ODVP 204, can be implemented. In ASIC layouts, ODVPs can be installed at one or more of the locations 402a-402p, where the components for the ODVP, such as inverters and other corresponding logic gates, are hardwired at one or more of the indicated locations. In FPGA layouts, ODVPs can be programmed at one or more of the locations 402a-402p, where unused programmable logic blocks exist. These programmable logic blocks can be programmed to implement components that form the ODVPs, such as inverters and other corresponding logic gates, in soft logic, as described above.

One of the distinctions between the hard logic and soft logic implementations of the ODVPs, as introduced above, is that in the hard logic embodiment (i.e., the ASIC type IC), the ODVPs must be located and hardwired when the IC layout 400 is initially created and formed. Thus, to appropriately implement the ODVPs, the user must know, when the ASIC is being created, where the user will need or want to measure transient and steady state voltages for components or supply voltages of the ASIC. This would allow the user to implement the ODVPs at one or more of the locations 402a-402p as needed. Once the ODVPs are formed at the one or more locations 402a-402p, they will be present for use as needed.

On the other hand, the soft logic embodiment enables the user to place the soft logic ODVPs dynamically after the FPGA IC is formed and implemented by simply programming the ODVPs into existing. Thus, during use of the FPGA IC, the user may identify power concerns of the FPGA IC and place one or more soft logic ODVPs at locations proximal to the concerning areas of the FPGA IC layout 400, such as at one or more of the locations 402a-402p. Furthermore, as conditions or operations change for the FPGA IC layout 400, the user may move or create additional ODVPs at one or more different locations 402 based on updated operations and newly identified concerns or target locations. The ASIC type IC layout 400 does not provide the user with an option to update the ODVPs after manufacture.

Another distinction is that creating the hard logic ODVPs for the ASIC type IC requires additional materials, namely the physical components to install at one of the locations 402a-402p. Furthermore, once the ODVPs are installed on the ASIC, there is no moving them or adding new ODVPs later without substantial effort and cost.

Figure 4B:
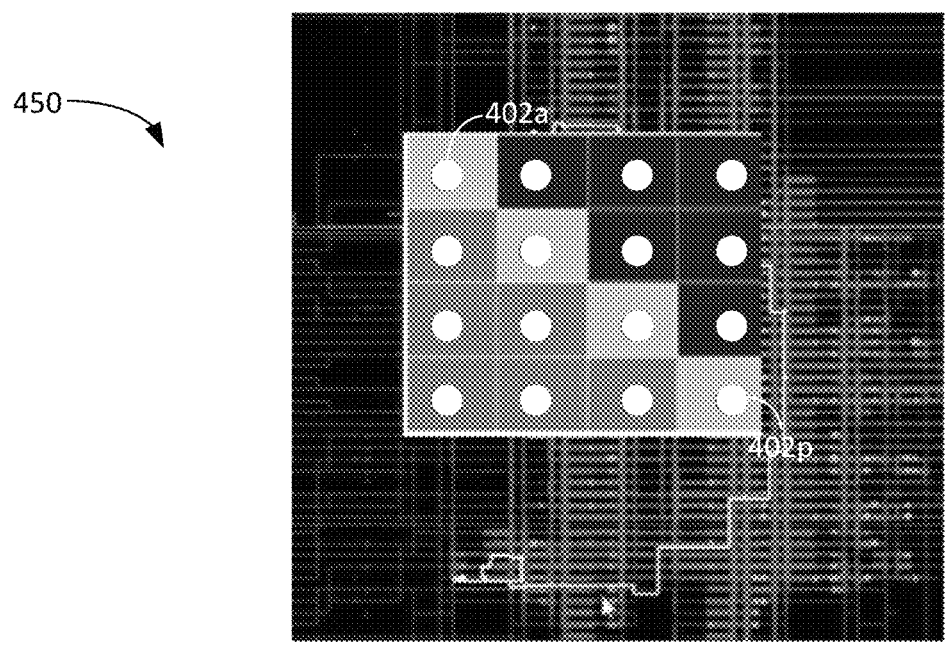
FIG. 4B shows an example heat map of the layout of FIG. 4A with indicators associated with each of the locations 402a-402p.

FIG. 4B shows an example heat map 450 of the layout 400 of FIG. 4A with indicators associated with each of the locations 402a-402p. The indicators may show whether different locations 402a-402p, having voltages measured using ODVPs disposed at each of the locations, have on-die transient voltages that are of concern or problematic, such as out of spec for the IC. For example, the heat map 450 shows, for the locations 402b-402d, 402g, 402h, and 402l, that the voltages have experienced a transient voltage drop or spike that exceeding allowable specifications. Similarly, the heat map 450 shows, for the locations 402a, 402f, 402k, and 402p, that the on-die transient voltages are outside allowable specifications. Similarly, the heat map 450 shows, for the locations 402e, 402i, 402j, and 402m-402o, that the voltages are within allowable specifications. Thus, the heat map 450 may provide a gradient of values that enables the user to graphically identify and/or monitor the on-die transient voltages measured by the ODVPs. In some embodiments, an ODVP controller, such as the ODVP controller 106 of FIG. 1 generates the heat map 450 based on the calibration and hardware testing information that associates a frequency of an oscillating signal generated by the ODVP with the transient on-die voltage at the ODVP.

Figure 5:
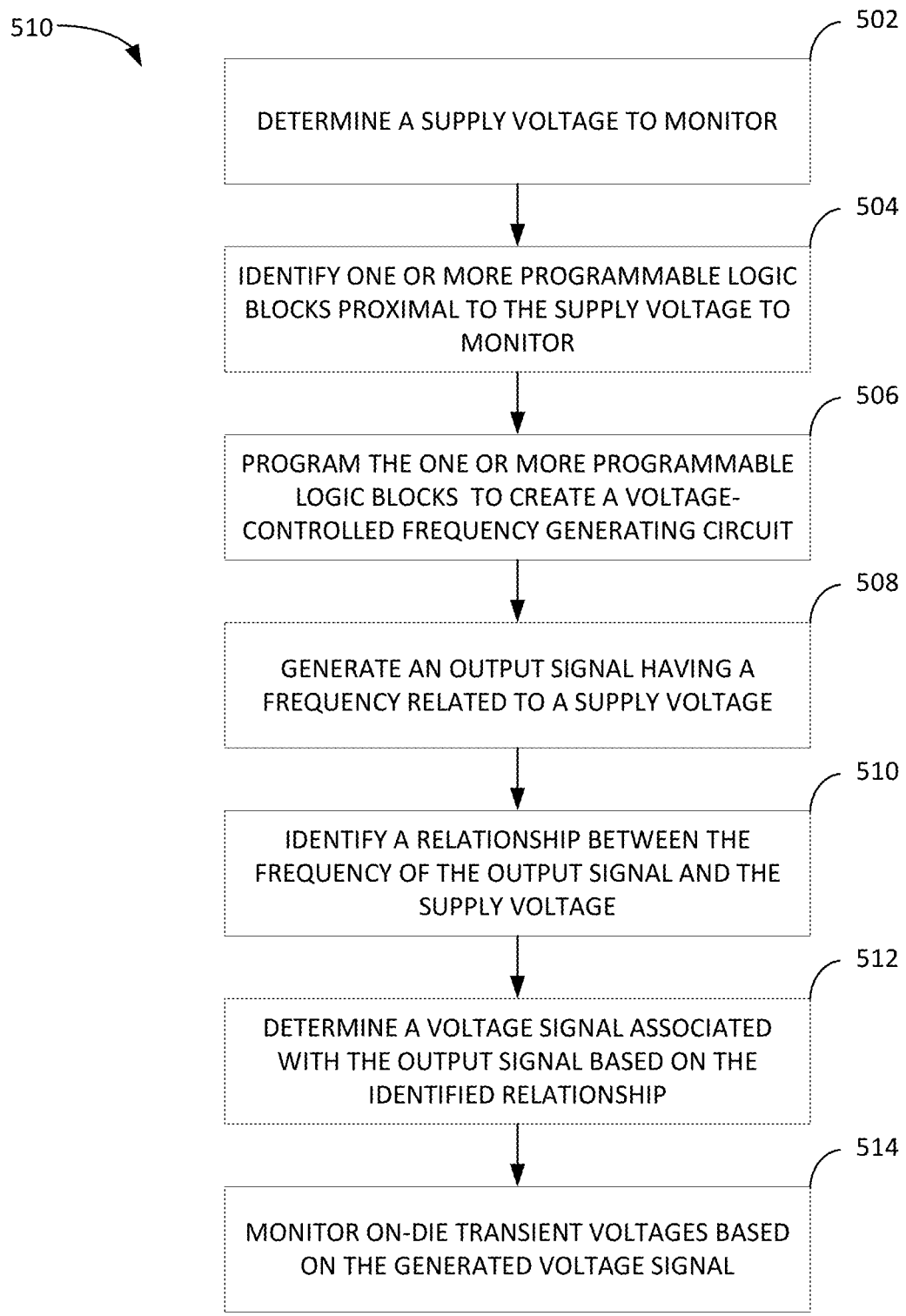
FIG. 5 is a flowchart of a method for dynamically programming an ODVP, such as the RO ODVP of FIG. 2, according to an example embodiment.

FIG. 5 is a flowchart of a method 500 for dynamically programming an ODVP, such as the RO ODVP 204 of FIG. 2, according to an example embodiment. In general, the method 500 can be used to dynamically create and deploy a soft logic ODVP at a location of an IC where transient and steady-state on-die voltages are to be monitored. In certain embodiments, steps of the method 500 can be performed in any order, additional steps can be added, or steps can be removed.

At block 502, an IC, such as the IC 100 of FIG. 1, determines or identifies a supply voltage to monitor for the IC. Such a determination may be made based on detection of a voltage based error or similar issues for one or more components or locations of the IC. In some embodiments, a controller, such as the ODVP controller 106 or the circuitry controller 102 of FIG. 1, performs the determination of the supply voltage to monitor. For example, the IC may detect a voltage error at a component of the IC and determine to monitor the supply voltage for the component to diagnose and troubleshoot the error.

At block 504, the IC identifies one or more programmable logic blocks (such as LUTs) proximal to the component and the supply voltage to be monitored. In some embodiments, the IC identifies unused LUTs at such a location. In some embodiments, in an ASIC, the IC may identify a location with the ODVP components wired and ready to be activated to measure transient and steady-state on-die voltages. In some embodiments, the controller identifies the one or more unused LUTs to be programmed.

At block 506, the IC programs the one or more LUTs to create a voltage controlled frequency generating circuitry. In some embodiments, the voltage-controlled frequency generating circuitry comprises an RO ODVP. In some embodiments, the controller programs the one or more LUTs.

At block 508, the voltage controlled frequency generating circuitry (for example, the RO ODVP) generates an output signal having a frequency related to a supply voltage. The IC or the controller may monitor the output signal.

At block 510, the IC identifies a relationship between the frequency of the output signal and the supply voltage. In some embodiments, the relationship may be identified based on the calibration and hardware testing described above. In some embodiments, the controller identifies the relationship.

At block 512, the IC determines or identifies a voltage signal associated with the output signal based on the identified relationship. The voltage signal may correspond to the transient on-die voltage at a location of the ODVP.

At block 514, the IC uses the generated voltage signal to monitor on-die transient and steady-state voltages of the supply voltage at the component of the IC. In some embodiments, the controller monitors the transient and steady-state voltages.

Monitoring the transient and steady-state on-die voltages may comprise employing on- or off-die components to measure one or more aspects of the transient and steady-state voltages. Where the transient or steady-state on-die voltages fall outside specifications, the IC (or similar component or device) may trigger an alert to the user or generate a heat map as shown in FIG. 4B of the IC, identifying areas of concern and so forth. In some embodiments, the IC may use identification of an out-of-spec transient or steady state on-die voltage to adjust operations of one or more components of the IC. For example, when the out-of-spec transient on-die voltage impacts a component, the IC may shut down that component or may alert other components to which the component may generate erroneous outputs, etc., due to the transient on-die voltage. In some embodiments, the IC controller may use the out-of-spec transient on-die voltage to perform dynamic frequency selection (DFS) or dynamic voltage selection (DVS).

In certain embodiments, the frequency of the output signal generated by the voltage-controlled frequency generating circuitry can be measured by an off-die oscilloscope or similar measurement equipment via one or more sets of terminals or points at which the oscilloscope can be connected to the voltage-controlled frequency generating circuitry to monitor the output signal. The oscilloscope may compare the monitored signal frequency and identify the corresponding transient and steady-state voltages (based on the relationship above, which is obtained by one or more calibration procedures), thereby monitoring the transient and steady-state on-die voltages of the IC. Where the oscilloscope identifies that the monitored transient or steady-state on-die voltage falls outside acceptable specifications, the oscilloscope can indicate to the IC an issue, which the IC can use to shut down affected components or alert the user or affected components.

In some embodiments, an on-die counter circuitry can monitor and count the number of transitions between 0 and 1 for the output signal generated by the voltage-controlled frequency generating circuitry over a period. The count generated by the counter circuitry and the period over which the count was generated can then be used to identify the frequency of the output signal. Thus, instead of using an off-die oscilloscope or similar equipment, the IC can perform frequency measurement of the frequency of the output signal on-die. The counter circuitry can be part of the ODVP, part of the ODVP controller, or part of a support circuit for the ODVP. Based on this frequency of the output signal, the IC can monitor the transient and steady-state on-die voltages (based on the relationship above). The IC can then identify whether the monitored transient or steady-state on-die voltage falls outside acceptable specifications and indicate to affected components, shut down affected components, alert the user or affected components, and so forth.

Figure 6A:
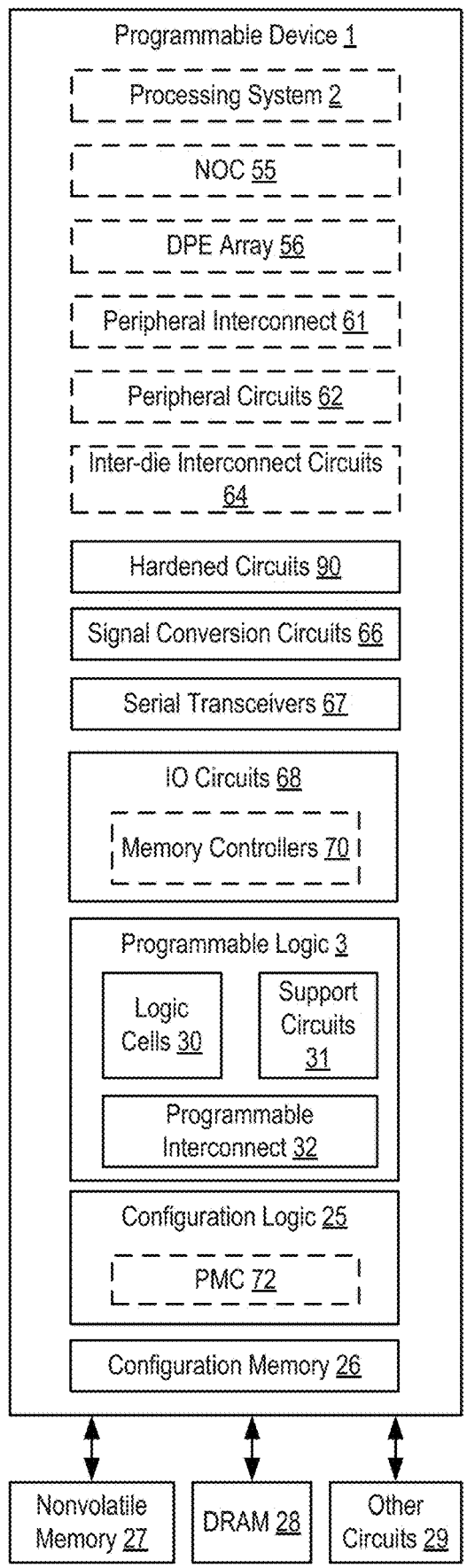
FIG. 6A is a block diagram depicting a programmable IC according to an example.

FIG. 6A is a block diagram depicting a programmable device 1 according to an example. The programmable device 1 includes programmable logic (PL) 3 (also referred to as a programmable fabric), input/output (IO) circuitries 68, serial transceivers 67, signal conversion circuitries 66, hardened circuitries 90, configuration logic 25, and configuration memory 26. The programmable device 1 can be coupled to external circuitries, such as nonvolatile memory 27, dynamic random access memory (DRAM) 28, and other circuitries 29. In various examples, the programmable device 1 further includes a processing system (PS) 2, a network-on-chip (NOC) 55, a data processing engine (LOPE) array 56, peripheral interconnect 61, peripheral circuitries 62, and inter-die interconnect circuitries 64.

The PL 3 includes logic cells 30, support circuitries 31, and programmable interconnect 32. The logic cells 30 include circuitries that can be configured to implement general logic functions of a plurality of inputs. For example, the logic cells 30 may include the soft logic ODVPs discussed above in FIGS. 1-5. The support circuitries 31 include dedicated circuitries, such as digital signal processors, memories, and the like. The logic cells and the support circuitries 31 can be interconnected using the programmable interconnect 32. Information for programming the logic cells 30, for setting parameters of the support circuitries 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuitries 29). In some examples, the configuration logic 25 includes a platform management controller (PMC) 72. The PMC 72 is configured to boot and configure the subsystems of the programmable device 1, such as the PL 3, the PS 2, the NoC 55, the DPE array 56, the signal conversion circuitries 66, the hardened circuitries 90, and the like.

The IO circuitries 68 provide an external interface for the subsystems of the programmable device 1, such as the PL 3, the PS 2, and the like. In some examples, the IO circuitries 68 include memory controllers 70 configured to interface external memories (e.g., the DRAM 28). Other connectivity circuitries can include the peripheral interconnect 61, the peripheral circuitries 62, and the inter-die interconnect circuitries 64. The peripheral interconnect 61 includes bus interface circuitries, such as peripheral component interconnect express (PCIe) circuitries and the like. The peripheral circuitries 62 include universal serial bus (USB) ports, Ethernet ports, universal asynchronous transceiver (UART) ports, serial peripheral interface (SPI) ports, general purpose IO (GPIO) ports, serial advanced technology attachment (SATA) ports, and the like. The inter-die interconnect circuitries 64 include circuitries configured to interface like inter-die interconnect circuitries in other programmable device(s) (e.g., for when the programmable device 1 is one die in a multi-die integrated circuit package). The serial transceivers 67 include high-speed transmit/receive circuitries configured to provide an external IO interface for the programmable device 1.

The PS 2 can include microprocessor(s), memory, support circuitries, IO circuitries, and the like. The NOC 55 is configured to provide for communication between subsystems of the programmable device 1, such as between the PS 2, the PL 3, the hardened circuitries 90, and the DPE array 56. The DPE array 56 can include an array of DPE's configured to perform data processing, such as an array of vector processors. The signal conversion circuitries 66 include analog-to-digital converters (ADCs) and digital-to-analog converters (DACs).

The hardened circuitries 90 comprise circuitries with predetermined functionality. A given hardened circuitry 90 can include one or more predetermined functions. Example hardened circuitries 90 include filters, mixers, sample-rate converters, transforms circuitries, and the like. A hardened circuitry 90 can be programmable to configure specific predetermined functionalities or select among predetermined functionalities. However, in contrast to a circuitry in the PL 3, a hardened circuitry 90 cannot be configured or reconfigured with different functionality. For example, a hardened circuitry 90 can include a filter having two predetermined and selectable functionalities. A third functionality cannot be added to the hardened circuitry 90, nor can one of the two functionalities be removed from the hardened circuitry 90. In contrast, a filter configured in the PL 3 can be reconfigured to add one more additional functionalities or to remove one or more functionalities. Further, a filter configured in the PL 3 can be removed entirely and replaced with another circuitry, In contrast, a hardened circuitry 90 cannot be removed from the programmable device 1 (but can be unused if desired).

Figure 6B:
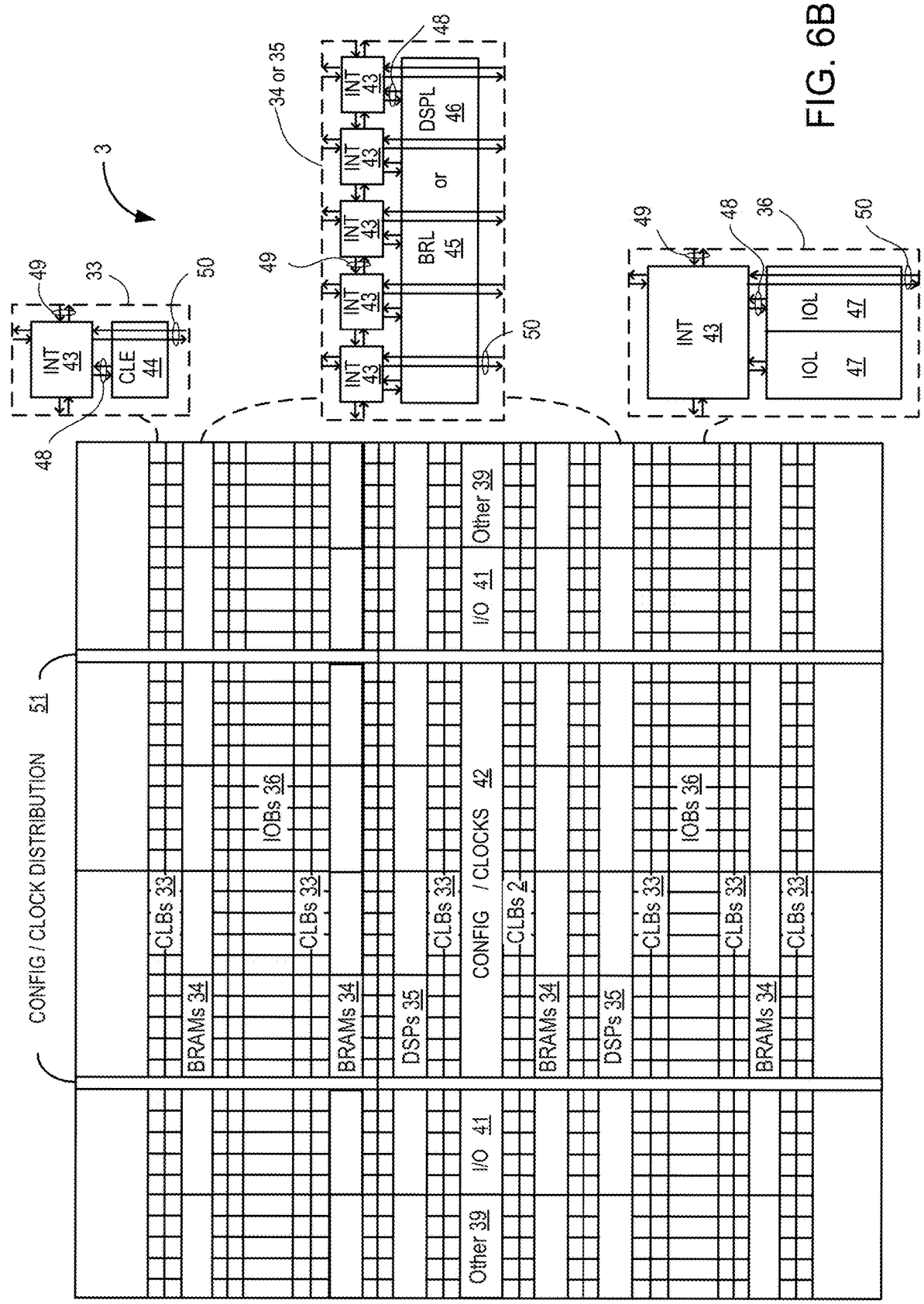
FIG. 6B illustrates a field programmable gate array (FPGA) implementation of a programmable IC according to an example.

FIG. 6B illustrates a field programmable gate array (FPGA) implementation of the PL 3 according to an example. The PL 3 shown in FIG. 6B can be used in any example of the programmable devices described herein. The PL 3 includes a large number of different programmable tiles including configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth.

In some PLs, each programmable tile can include at least one programmable interconnect element ("INT") 43 having connections to input and output terminals 48 of a programmable logic element within the same tile, as shown by examples included at the top of FIG. 6B, Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated PL.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 6B) is used for configuration, clock, and other control logic. Vertical columns 51 extending from this horizontal area or column are used to distribute the clocks and configuration signals across the breadth of the PL.

Some PLs utilizing the architecture illustrated in FIG. 6B include additional logic blocks that disrupt the regular columnar structure making up a large part of the PL. The additional logic blocks can be programmable blocks and/or dedicated logic.

Note that FIG. 6B is intended to illustrate only an exemplary PL architecture. For example, the numbers of logic blocks in a row, the relative width of the rows, the number and order of rows, the types of logic blocks included in the rows, the relative sizes of the logic blocks, and the interconnect/logic implementations included at the top of FIG. 6B are purely exemplary. For example, in an actual PL more than one adjacent row of CLBs is typically included wherever the CLBs appear, to facilitate the efficient implementation of user logic, but the number of adjacent CLB rows varies with the overall size of the PL.

Figure 6C:
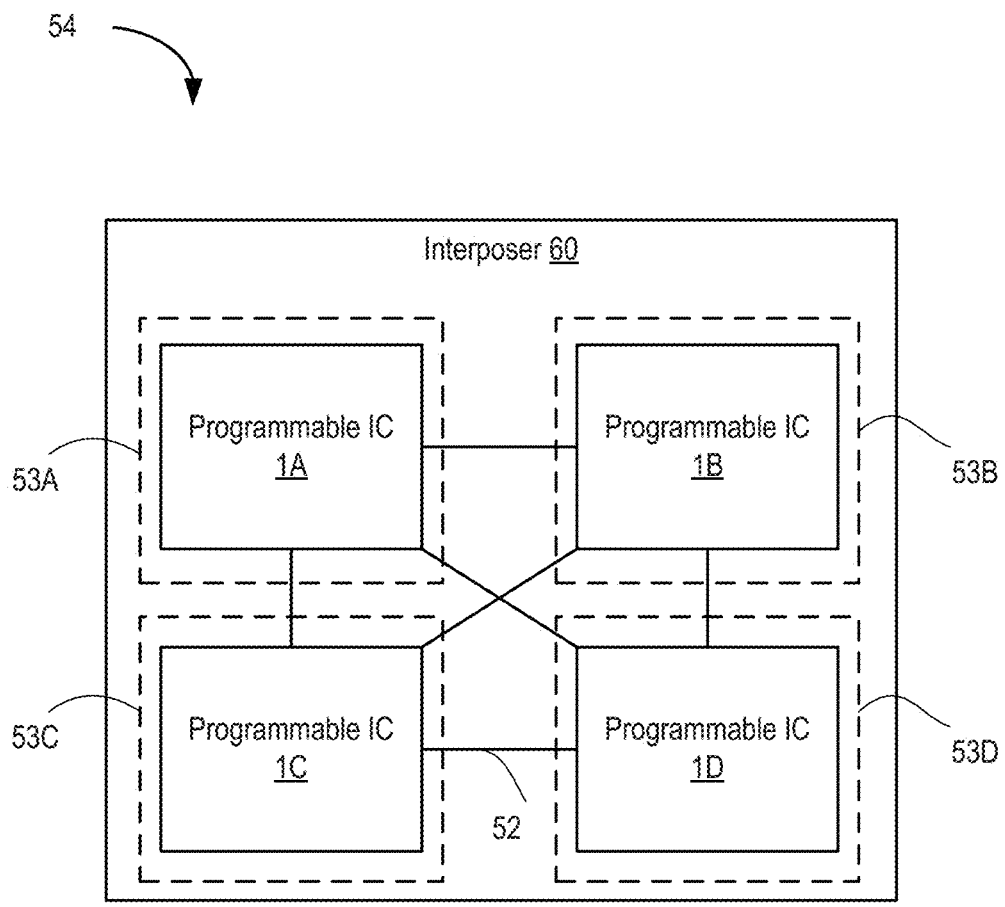
FIG. 6C is a block diagram depicting a multi-integrated circuit (IC) programmable device according to an example.

FIG. 6C is a block diagram depicting a multi-die programmable device 54 according to an example. The multi-die programmable device 54 includes a plurality of programmable devices 1, e.g., programmable devices 1A, 1B, 1C, and 1D. In an example, each programmable device 1 is an IC die disposed on an interposer 60. Each programmable device 1 comprises a super logic region (SLR) 53 of the programmable device 54, e.g., SLRs 53A, 53B, 53C, and 53D. The programmable devices 1 are interconnected through conductors on the interposer 60 (referred to as super long lines (SLLs) 52) and inter-die interconnect circuitries 64 disposed within each of the programmable devices 1. The programmable ICs could include the programmable logic blocks that form the ODVP circuitries described above in FIGS. 1-6C.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or apparatus, and the like. Accordingly, aspects may take the form of an entirely hardware embodiment or a combination of hardware products or an embodiment combining hardware aspects with corresponding programming that may all generally be referred to herein as a "circuitry" or "system." Furthermore, certain aspects, such as programmable logic blocks, lookup tables (LUTs), and the like, may take the form of hardware components that can be controlled using corresponding programming.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations or programming for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and apparatuses according to various examples of the present invention. In this regard, each block in the flowchart or block diagrams may represent a circuitry, programming for such circuitry, or portion of instructions for such circuitry, which comprises one or more executable instructions for controlling or programming the circuitry to perform the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit, comprising:
  a voltage-controlled frequency oscillator circuitry comprising a plurality of circuitry components and configured to generate a signal having a frequency related to a supply voltage, wherein the voltage-controlled frequency oscillator circuitry is disposed at a location of the integrated circuit proximal to the supply voltage being monitored; and
  a processor circuitry configured to:
    identify a relationship between the frequency of the signal and the supply voltage;
    determine a value of the supply voltage associated with the signal based on the identified relationship; and
    monitor on-die transient voltages at the location of the integrated circuit based on the value of the supply voltage.

2. The integrated circuit of claim 1, wherein the processor circuitry is further configured to monitor the on-die transient voltages over a period and calculate a steady-stage voltage at the location over the period.

3. The integrated circuit of claim 1, wherein a steady-state average frequency of the signal corresponds to a steady-state voltage drop at the location of the integrated circuit.

4. The integrated circuit of claim 1, wherein:
  the plurality of circuitry components comprises at least one inverter stage implemented using a hard logic component; and
  the integrated circuit comprises an application specific integrated circuit (ASIC).

5. The integrated circuit of claim 1, wherein:
  the plurality of circuitry components comprises at least one inverter stage implemented using a lookup table (LUT); and
  the integrated circuit comprises a programmable logic device (PLD).

6. The integrated circuit of claim 1, wherein the plurality of circuitry components comprises an odd number of inversions arranged in a loop to form the voltage-controlled frequency oscillator circuitry.

7. The integrated circuit of claim 1, wherein the voltage-controlled frequency oscillator circuitry comprises a ring oscillator.

8. The integrated circuit of claim 1, wherein the frequency of the signal is in a range of 500 MHz to 1 GHz.

9. The integrated circuit of claim 8, further comprising a counter circuitry configured to count cycles of the signal over an amount of time and identify the frequency of the signal based on the cycles and the amount of time.

10. The integrated circuit of claim 1, further comprising terminals enabling measurement of the frequency of the signal by an external measurement device.

11. The integrated circuit of claim 1, further comprising a second voltage-controlled frequency oscillator circuitry comprising a second plurality of circuitry components and configured to generate a second signal having a frequency related to a second supply voltage,
  wherein:
    the second voltage-controlled frequency oscillator circuitry is disposed at a second location of the integrated circuit proximal to the second supply voltage being monitored, and
    the processor circuitry is further configured to:
      identify a relationship between an aspect of the second signal and the second supply voltage;
      determine a value of the second supply voltage associated with the second signal based on the identified relationship; and
      monitor second on-die transient voltages at the second location of the integrated circuit based on the value of the second supply voltage.

12. An integrated circuit, comprising:
  a plurality of inverter circuits connected in series to form a loop circuitry configured to generate an oscillatory signal having a frequency related to a supply voltage,
  wherein:
    the plurality of inverter circuits are disposed on the integrated circuit near a target location;

a value of the supply voltage is determined based on an identified relationship between the frequency of the oscillatory signal and the supply voltage; and on-die voltages at the target location of the integrated circuit are monitored based on the value of the supply voltage.

13. The integrated circuit of claim 12, wherein:

the plurality of inverter circuits is implemented using LUTs; and the integrated circuit comprises a programmable logic device.

14. The integrated circuit of claim 12, wherein the loop circuitry comprises an odd number of inversions and forms a ring oscillator.

15. The integrated circuit of claim 12, further comprising a counter circuitry configured to count cycles of the oscillatory signal over an amount of time and identify the frequency of the oscillatory signal based on the cycles and the amount of time.

16. A method for measuring transient on-die transient voltages of an integrated circuit, comprising:

identifying one or more programmable logic blocks at a location of the integrated circuit proximal to a supply voltage to monitor;

programming the one or more programmable logic blocks to create a voltage-controlled frequency generating circuitry;

generating a signal having a frequency related to the supply voltage;

identifying a relationship between an aspect of the signal and the supply voltage;

determining a value of the supply voltage associated with the signal based on the identified relationship; and monitoring the on-die transient voltages at the location of the integrated circuit based on the value of the supply voltage.

17. The method of claim 16, further comprising:

counting cycles of the signal, using a counter circuitry, over an amount of time, and identifying the frequency of the signal based on the counted cycles.

18. The method of claim 16, wherein the integrated circuit comprises an FPGA.

19. The method of claim 16, wherein the voltage-controlled frequency generating circuitry comprises an odd number of inversions arranged in a loop to form a ring oscillator.

20. The method of claim 16, further comprising measuring the frequency of the signal via a measurement device counting cycles of the signal over an amount of time.

* * * * *